United States Patent [19]

Lee et al.

[11] Patent Number: 5,185,282
[45] Date of Patent: Feb. 9, 1993

[54] METHOD OF MANUFACTURING DRAM CELL HAVING A CUP SHAPED POLYSILICON STORAGE ELECTRODE

[75] Inventors: Jin H. Lee; Cheon S. Kim; Kyu H. Lee; Dae Y. Kim, all of Daejeon, Rep. of Korea

[73] Assignee: Electronics and Telecommunications Research Institute, Chungnam, Rep. of Korea

[21] Appl. No.: 602,807

[22] Filed: Oct. 24, 1990

[30] Foreign Application Priority Data

Nov. 23, 1989 [KR] Rep. of Korea .................. 89-17060
Nov. 23, 1989 [KR] Rep. of Korea .................. 89-17061

[51] Int. Cl.$^5$ .......................................... H01L 21/70
[52] U.S. Cl. ...................... 437/47; 437/48; 437/52
[58] Field of Search .................. 437/47, 48, 52; 357/23.6

[56] References Cited

FOREIGN PATENT DOCUMENTS

| | | | |
|---|---|---|---|
| 0117354 | 5/1989 | Japan | 437/52 |
| 0257365 | 10/1989 | Japan | 357/23.6 |
| 0122560 | 5/1990 | Japan | 437/52 |
| 0226761 | 9/1990 | Japan | 437/52 |
| 0260454 | 10/1990 | Japan | 437/52 |

OTHER PUBLICATIONS

Kaga et al., "Crown-shaped Stacked Capacitor Cell for 1.5 V Operation 64-Mb DRAM's", IEEE transactions on electron devices, vol. 38, No. 2, Feb. 1991, p. 255.

Primary Examiner—Olik Chaudhuri
Assistant Examiner—Ourmazd S. Ojan

[57] ABSTRACT

A DRAM cell of a stack structure having a cup-shaped polysilicon storage electrode for being applied to a 16 mega and 64 mega DRAM wherein a transfer transistor is firstly manufactured, a bit line is formed, an oxide film grid is formed between the cell and cell in the minimum design rule, and upon completing this, the polysilicon storage electrode is formed into a single or double cup shape, whereby the capacitor area is remarkably increased when compared with the conventional stacked structure DRAM cell so that the area efficiency is greatly increased and the process can be executed by such a mask number as the prior stacked structure mask layer number and the structure thereof is simple.

2 Claims, 7 Drawing Sheets

METHOD OF MANUFACTURING DRAM CELL HAVING A CUP SHAPED POLYSILICON STORAGE ELECTRODE

BACKGROUND OF THE INVENTION

1. Field of the Invention

The present invention relates to a memory cell having a stacked structure and its method of manufacture and more particularly, to a dynamic random access memory (hereinafter DRAM) cell of a stacked structure having a cup shaped polysilicon storage electrode capable of being applied to 16 mega and 64 mega DRAM cells.

2. Description of the Prior Art

Conventionally, various types of semiconductor memory devices are well known in the art. In such semiconductor memory devices, it is a conventional situation that a 1 mega DRAM has already come to mass production, a 4 mega DRAM has come to pilot production, a 16 mega DRAM has come to being a new product, and a 64 mega DRAM is developing successively.

In order to develop such large quantity memory devices, fundamental techniques, such as lithographic techniques or thin film forming techniques, should be developed. The DRAM cell of fundamental element for the DRAM structure should also be developed.

According to such demands, the DRAM cell development has repeated many changes from a plane structure to a trench or a stacked structure, and it is being developed to maximize the area efficiency as far as possible under a condition that its method of manufacture is allowed.

Recently, the stacked structure of a highly integrated DRAM cell is preferred due to the ease of manufacture and immunity to the alpha particle.

In the process for manufacturing a conventional stacked type cell, as a limiting condition for increasing the area of the storage electrode, there are area and height characteristics of the storage electrode.

For the purpose of the contact of a bit line and a drain of a transfer transistor, the area of the capacitor cannot be increased up to more than a contacting region, and also when the storage electrode is raised up in order to increase the area of the storing electrode, difficulties may occur with respect to the contact of the bit line.

FIG. 1a shows a cross-sectional view of a conventional stack structure DRAM cell, wherein a storage node is raised up, and the bit line step coverage becomes worse. Since the bit line contacting area should be ensured, it cannot be expanded to more than the present storage electrode area.

FIG. 1b is a cross-sectional view of a DRAM cell disclosed by Mitsubishi Company of Japan and announced at the VLSI symposium in 1989, which is a stacked structure DRAM cell including a storage node pattern made to a cylindrical form whereby an interior and exterior of the cylinder is utilized as a charge storing capacitor.

This makes the electrode forming area large because the cylindrical type storage node is made by utilizing a polysilicon spacer so that thickness of the cylinder node can be formed to less than the minimum design rule.

However, when the storage node is raised up, the bit line step coverage causes a problem and the storage node cannot be extended laterally any more because of the bit line contact forming area. There is a disadvantage in that the cylindrical type node should be made sufficiently less than a polysilicon pad because of an overlay accuracy problem of the cylindrical type node and the polysilicon pad with respect to the node contact. Accordingly, a tungsten plug is used for the bit line contact and 30 fF of storing capacitor value is obtained by use of 5 nm of effective oxide film and 1.5 μm in height of the storing electrode.

However, the DRAM cell of the above-described structure has problems in that its manufacturing process is complicated and the number of mask layers is increased.

FIG. 1c is a cross-sectional view of DASH (diagonal active stacked capacitor cell with a highly-packed storage node) cell of Hitachi Company of Japan, which is structured with an active region made to pass with an angle of 45 degrees to the bit line whereby the bit line is formed before the storing electrode and thereafter, the storage node is formed.

Since a method of forming the bit line is conducted previously, it may be an advantage that the storing electrode can be formed up to above the bit line contact region. However, the form of the storage node is not suitable for the DRAM cell of 64 mega class since the electrode of a conventionally existing stacked structure is used as it is.

SUMMARY OF THE INVENTION

Accordingly, it is an object of the present invention to provide a DRAM cell of a stacked structure having a cup shaped polysilicon storage electrode which is made to increase the area efficiency for manufacturing the highly integrated semiconductor DRAM.

Another object of the present invention is to provide a method for forming a DRAM cell which comprises the steps of first manufacturing a transfer transistor, then forming a bit line, forming an oxide film grid between the cell and a cell with the minimum design rule, and upon completing this, forming a polysilicon storage electrode in a single or double cup shape, whereby the capacitor area is extended remarkably when compared with the conventional stacked structure DRAM cell by using a stacked structure DRAM cell utilizing the storage node.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a DRAM cell of a stacked structure having a cup-shaped polysilicon storage electrode for being applied to 16 mega and 64 mega DRAM wherein a transfer transistor is first manufactured, a bit line is formed, an oxide film grid is formed between the cell and a cell in the minimum design rule, and upon completing this, the polysilicon storage electrode is formed into a cup shape in a single or double formation, whereby the capacitor area is remarkably increased when compared with the conventional stacked structure DRAM cell so that the area efficiency is greatly increased and the process can be executed by such mask number as the prior stacked structure mask layer number and the structure thereof is simple.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
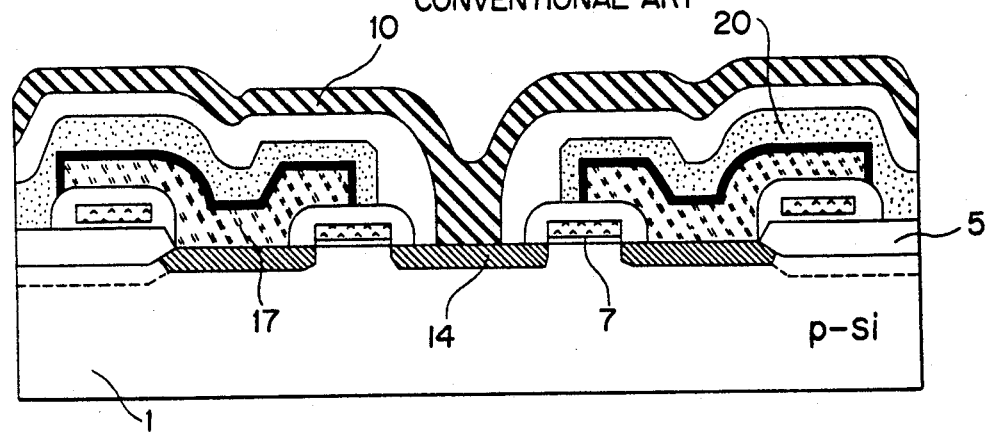
FIG. 1a is a cross-sectional view of the conventional stacked structure DRAM cell.
FIG. 1b is a cross-sectional view of DRAM cell having a structure of the conventional cylinder type storage electrode.
FIG. 1c is a cross-sectional view of the DRAM cell of the conventional DASH structure.
Figure 1:
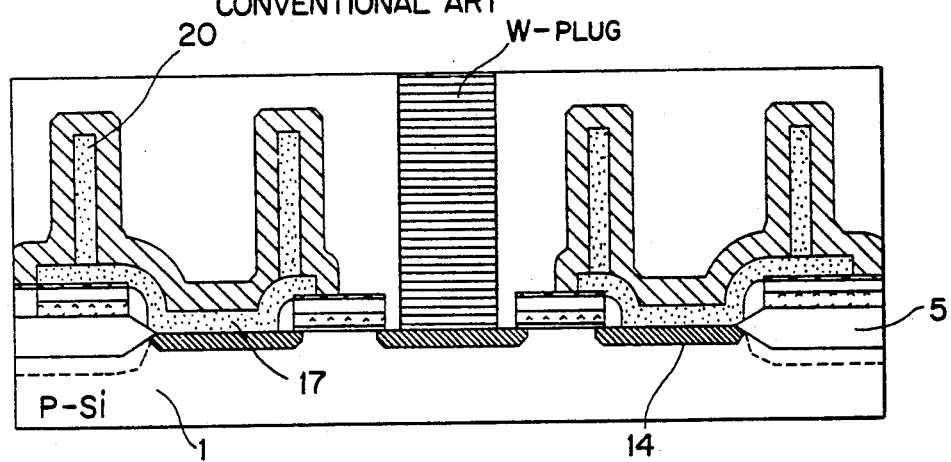
Figure 1:
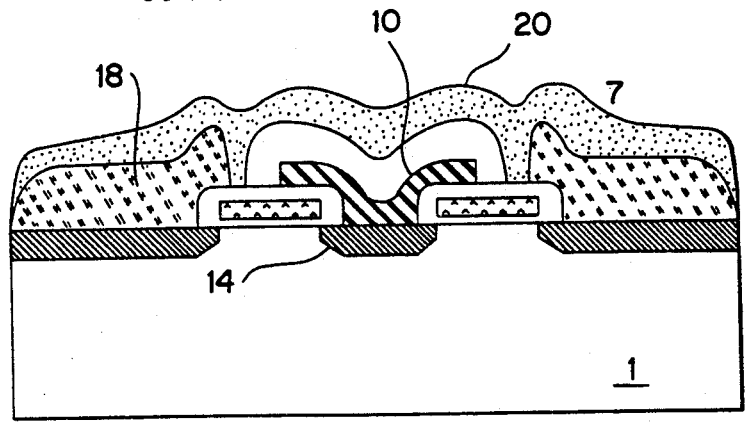
Figure 2A:
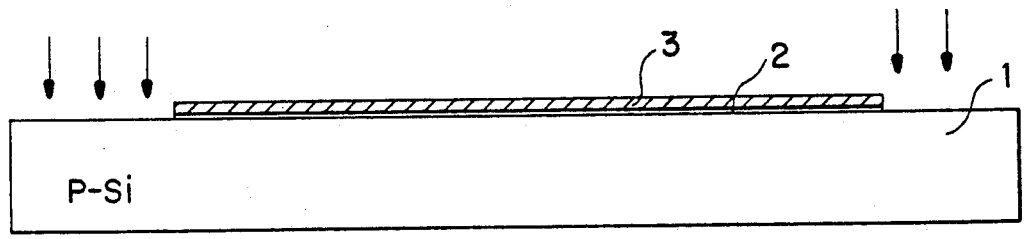
FIGS. 2a to 2h are cross-sectional views for showing manufacturing processes of a first embodiment of the present invention.

Referring now in detail to the drawings for the purpose of illustrating preferred embodiments of the present invention, the process for forming the DRAM cell having a cup shaped polysilicon storage electrode as shown in FIGS. 2a to 2h comprises the steps of as follows:

FIG. 2a shows a defining step of an active region, wherein a pad oxide film 2 and a silicon nitride film 3 are spread in thicknesses of about 25 nm and 100 nm on the top surface of p-type silicon substrate 1 respectively, and then the active region is defined and the silicon nitride film 3 of the entire region except the active region is etched. Thereafter, boron is ion implanted by energy of 60 keV and a dose of 3E 13 cm$^{-2}$.

Figure 2B:
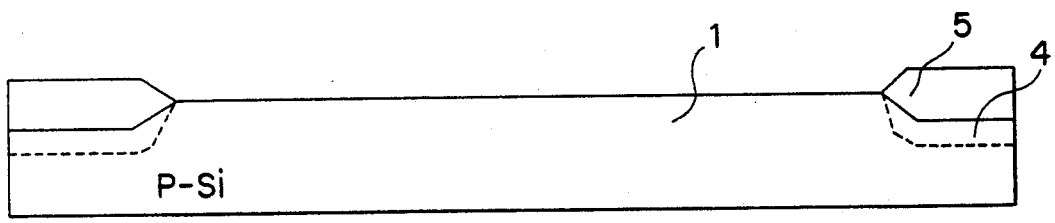

FIG. 2b shows a forming step of a field oxide film 5, wherein the state that boron is ion implanted, the field oxide film 5 is grown to thickness of about 50 nm to the region except the active region by the LOCOS (Local oxidation of silicon) method or SWAMI (Side wall isolation) method and simultaneously, a P-type diffusion layer 4 is formed at the lower stage and then the remaining silicon nitride film 3 is eliminated by wet etching and the pad oxide film 2 is also eliminated with buffered HF.

Figure 2C:
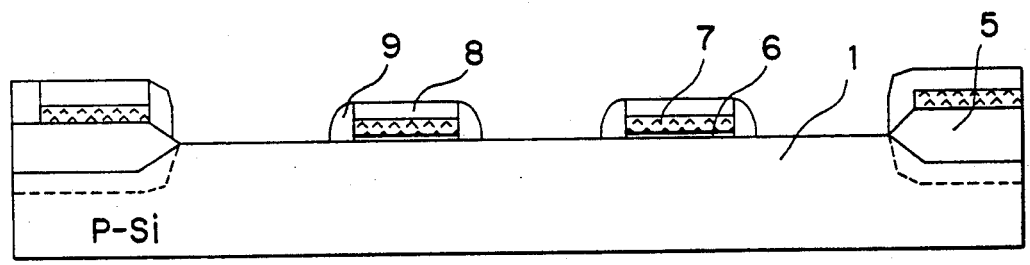

FIG. 2c shows a forming step of a gate side wall spacer, wherein a gate oxide film 6 is grown to a thickness of about 10 nm by a thermal oxidation method under the environment of adding TCA (trichloroethane) in a small quantity. Thereafter, a polysilicon layer 7 is deposited at the thickness of about 300 nm by a low pressure chemical vapor deposition method, n+ doped under the environment of POCl$_3$; and deglazed. And, an LTO (low temperature oxide) layer 8 is doped at the thickness of about 300 nm, dry etched in the order of the LTO 8 and the polysilicon layer 7 by utilizing the gate mask, and spread again to the thickness of about 300 nm and etched by the RIE method so that the oxide film side wall spacer 9 remains.

Figure 2D:
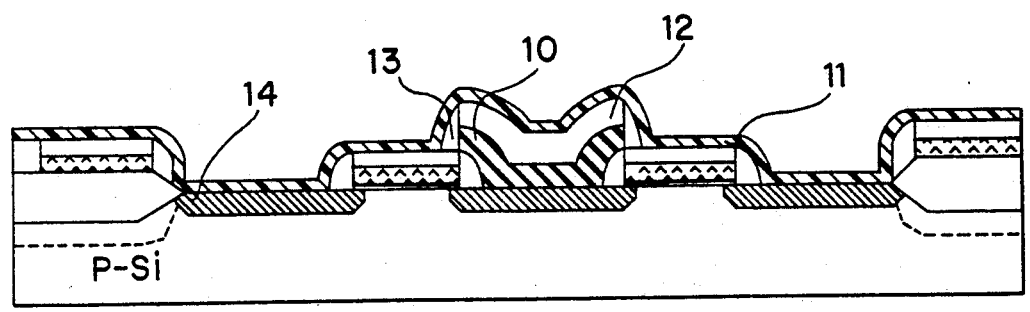

FIG. 2d shows a forming step of the bit line, wherein the portion excluded with a previously defined gate region, i.e., the portion of a source and drain 14, are ion implanted with an energy of 50 keV and a dose of 1E 16 cm$^{-2}$ by utilizing arsenic (As) ion, and thermally processed for about 10 seconds at 1100° C. by a RTP (rapid thermal processor) whereby the source and drain 14 are formed.

Thereafter, the polysilicon is spread to a thickness of about 300 nm by the low pressure chemical vapor deposition method, doped under an environment of POCl$_3$, and deglazed, and TiSi 2.6 or WSi$_2$ is spread at a thickness of about 100 nm, and during the thermal processing for 30 seconds at the temperature of 800° C. by RTP, a polysilicide layer 10 for the bit line is formed.

Figure 6:
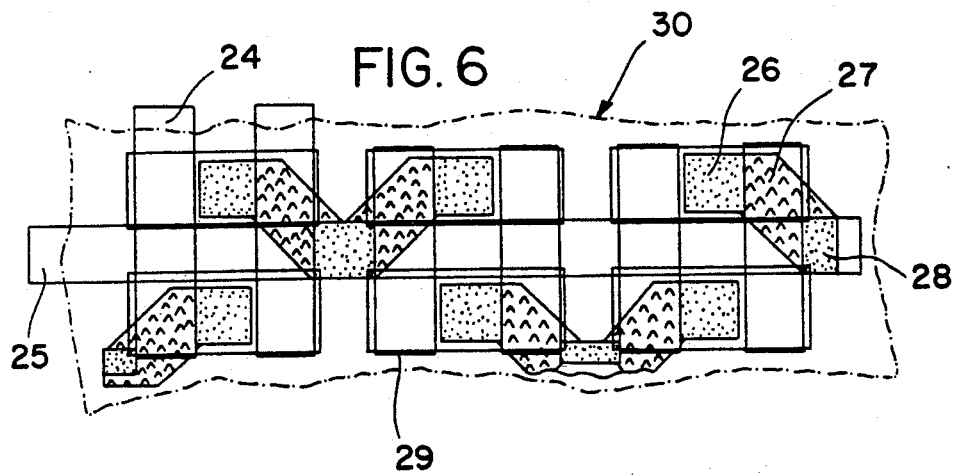
FIG. 6 is a schematic diagram for showing the state of a layout of the present invention.

The LTD 12 is spread in the thickness of about 300 nm thereon and then the bit line is defined by the bit line mask, dry etched in the order of the LTD 12 and polysilicide layer 10, and spread again at a thickness of about 300 nm and dry etched as much as the thickness, whereby the bit line side wall spacer 13 is formed so that an isolating function among the storage electrode, plate electrode, and bit line is achieved. In this embodiment, the active region is arranged in a V-shaped structure as shown in FIG. 6.

As one of the methods used in many cases, generally, in order to make the bit line prior to the storage electrode, while the bit line is running in the lengthwise direction of the active region, it is possible to use a structure in which the bit line is slightly protruded in from for contact of the bit line with the active region. However, when the active region is a V-shaped structure since the area of the active region can be reduced, it is possible to take advantage of the junction with leakage and capacitance. The silicon nitride film 11 is spread at a thickness of about 50-100 nm, wherein the silicon nitride film is utilized for an etch stop layer of the oxide film in the case of forming the oxide film of a grid shape.

Figure 2E:
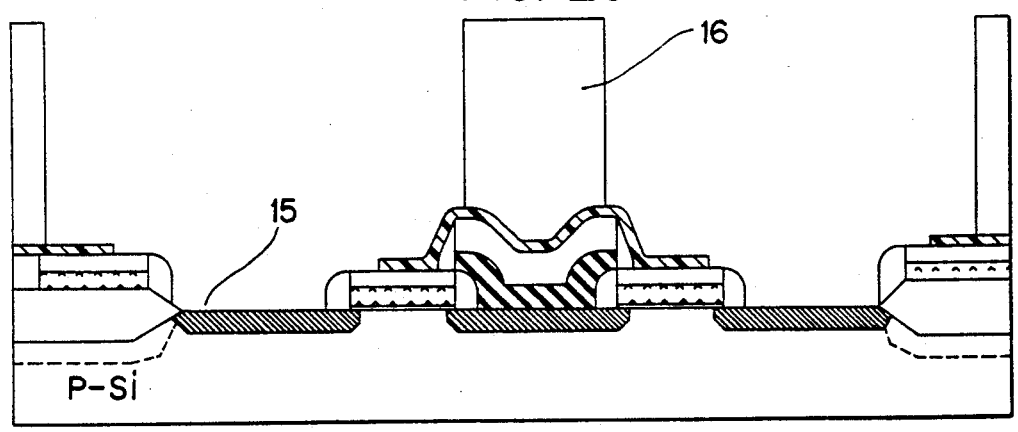

FIG. 2e shows a forming step of the oxide film of the grid shape for forming a charge storage electrode, wherein after the silicon nitride film is spread, while a contacting portion 15 between the storage electrode and source portion of the transistor is defined largely enough, the etching is executed so that in the case of depositing the polysilicon, the electrode forming and source contact are simultaneously made and self aligned contact is achieved.

The oxide film is deposited at a thickness of about 1-2 μm by the chemical vapor deposition (CVD) method, and then etching is executed while the pattern is formed at the minimum design rule whereby the oxide film 16 of the grid shape is formed. The narrower the design rule of oxide film 16 of the grid shape, the larger the forming area of the charge electrode, and it is important to form an oxide film pattern of the design rule on the surface having crook by such a method as the lift-off or MLR (multi layer resist), over exposure or else advanced lithographic technique.

Figure 2F:
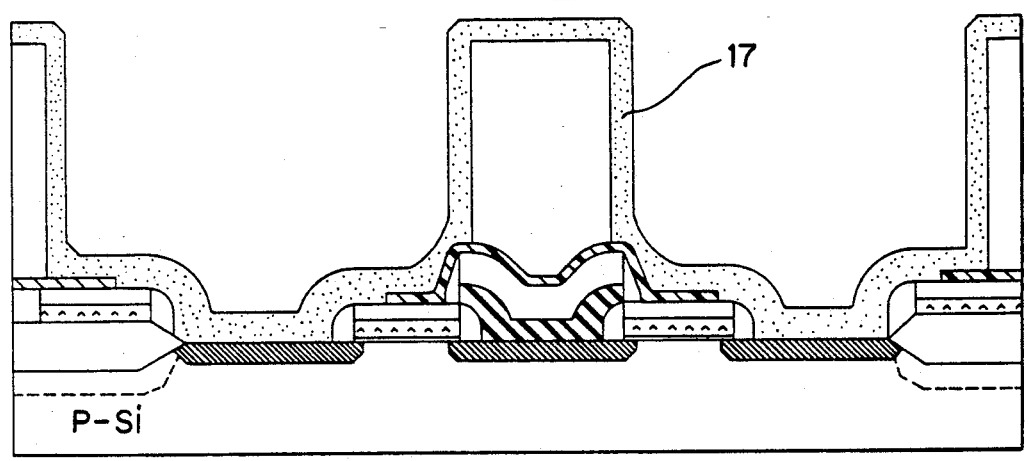

FIG. 2f shows a forming step of the polysilicon electrode, wherein after the oxide film 16 of the grid shape is formed, the polysilicon is deposited at a thickness of about 50-100 nm whereby the polysilicon electrode 17 of the charge storage electrode is formed.

Figure 2G:
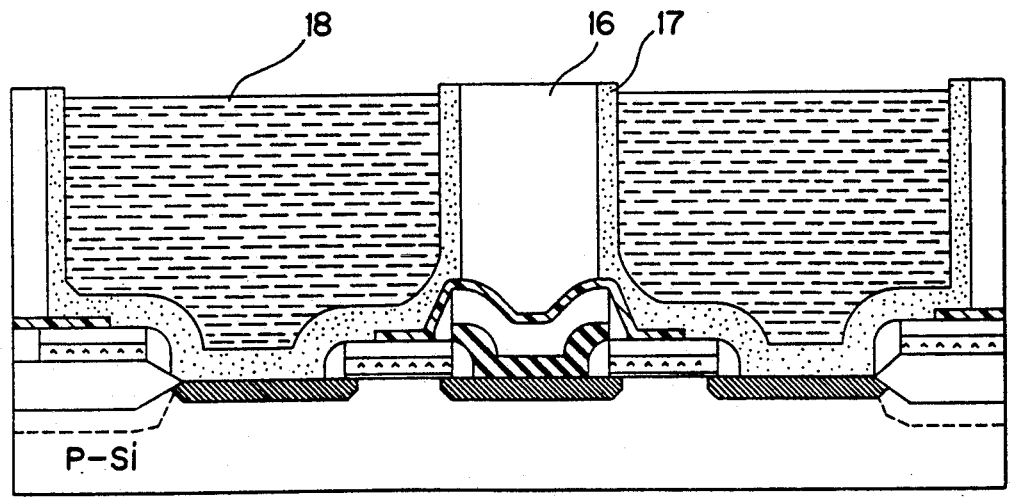

FIG. 2g shows an isolating step of the charge storage electrode from an adjoining cell, wherein after a photo resist 18 of liquid phase is filled higher than the height of the oxide film 16 of the grid shape, the photo resist 18 is etched back under oxygen plasma environment whereby the polysilicon located at the top end portion of the grid is exposed. The polysilicon of the polysilicon electrode 17 is etched back whereby only the polysilicon of the top end portion located at the upper portion of the oxide film 16 of the grid shape is etched and simultaneously isolated from the adjoining cell whereby the storage electrode of the cup shape is manufactured. At this moment, while the polysilicon of the bottom end portion located at the bottom remains as it is, it is made so as to be in a state such that the polysilicon electrode 17 and the source of the transistor are connected together.

Figure 2H:
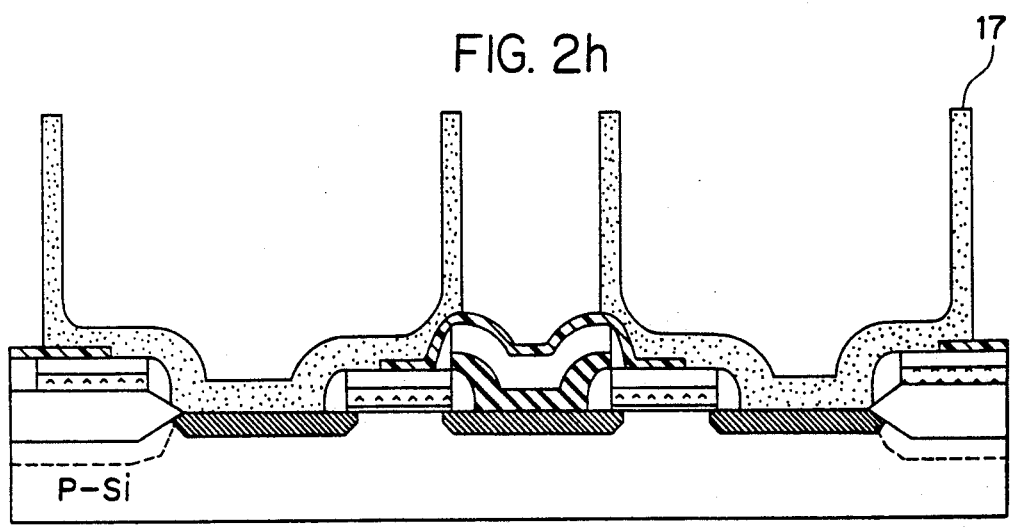

FIG. 2h shows an exposing step of the charge storing electrode, wherein after the photo resist film 18 of liquid phase is eliminated, the oxide film 16 of the grid shape is eliminated in all by wet etching whereby the polysilicon electrode 17 of the charge storing electrode is caused to be exposed. Sacrificial oxide in a thickness of about 400 angstroms is grown on the exposed polysilicon electrode 17 and then etched whereby the surface of the polysilicon electrode 17 is made to be smooth and thereafter, n+ doped under the environment of POCl3 and deglazed. The capacitor dielectric film 19 is formed to be thin at a thickness of about 4-8 nm and the capacitor dielectric film, at this moment, utilizes the structure ONO (oxide film/silicon nitride film/oxide) or NO (silicon nitride film/oxide film).

Figure 3:
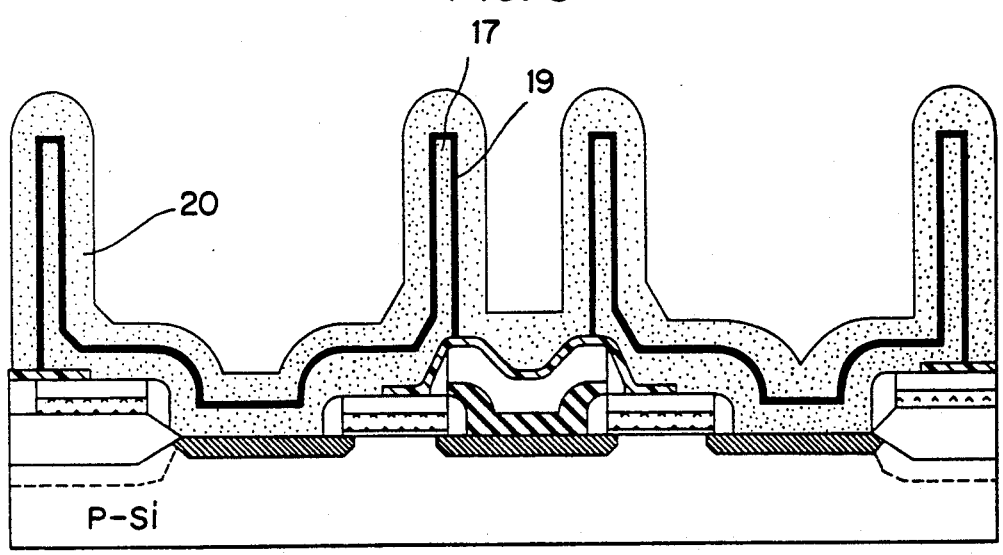
FIG. 3 is a cross-sectional view of a stacked structure having one cup shape according to the first embodiment of the present invention.

The polysilicon for a plate is deposited on the external surface of the capacitor dielectric film 19 and also doped with POCl3 and then defined by the plate mask and etched whereby a plate electrode 20 is formed so that the method of forming the DRAM cell structure having a one cup shaped storage electrode according to the first embodiment of the present invention as shown in FIG. 3, is completed.

FIGS. 4a to 4i show the process of a second embodiment of the present invention, wherein the processes 4a to 4f are the same as those in FIGS. 2a to 2f of the first embodiment of the present invention.

Figure 4A:
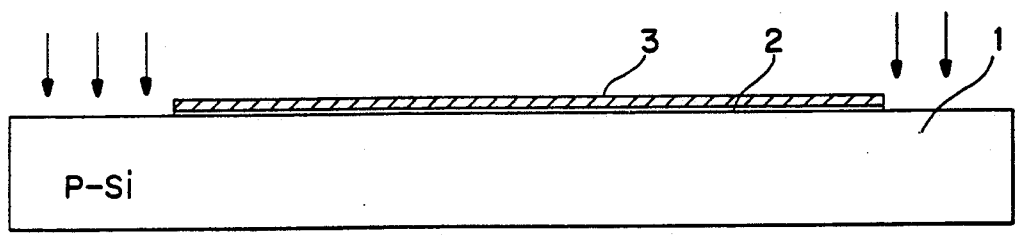
FIGS. 4a to 4i are cross-sectional views for illustrating manufacturing processes according to the second embodiment of the present invention.
Figure 4B:
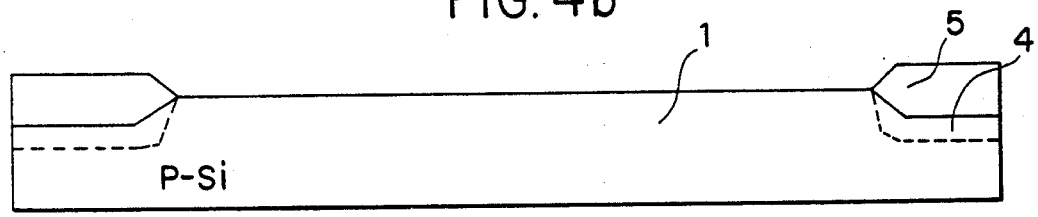
Figure 4C:
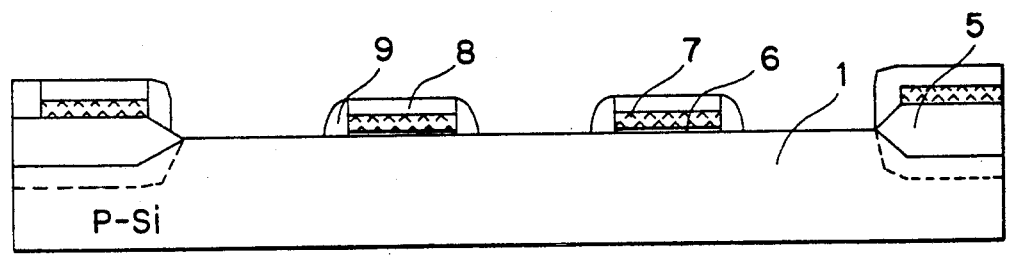
Figure 4D:
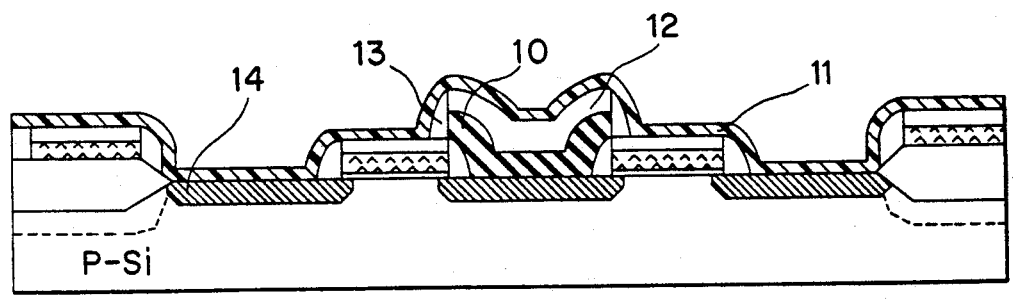
Figure 4E:
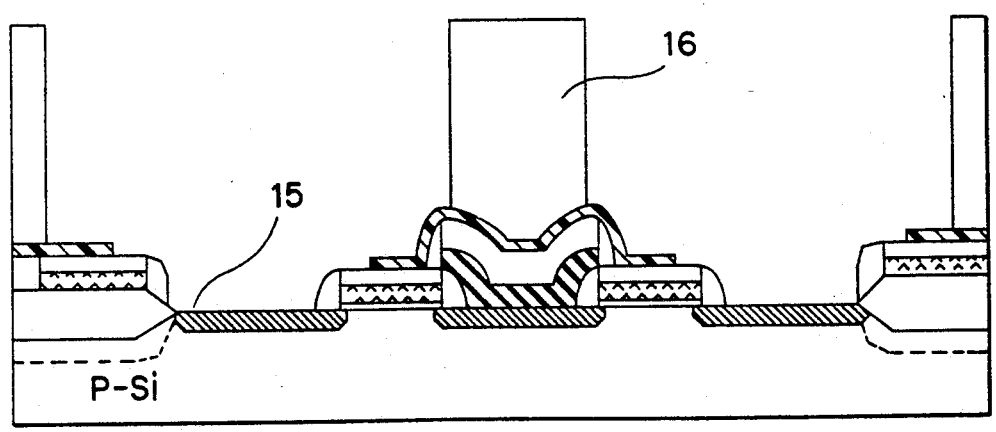
Figure 4F:
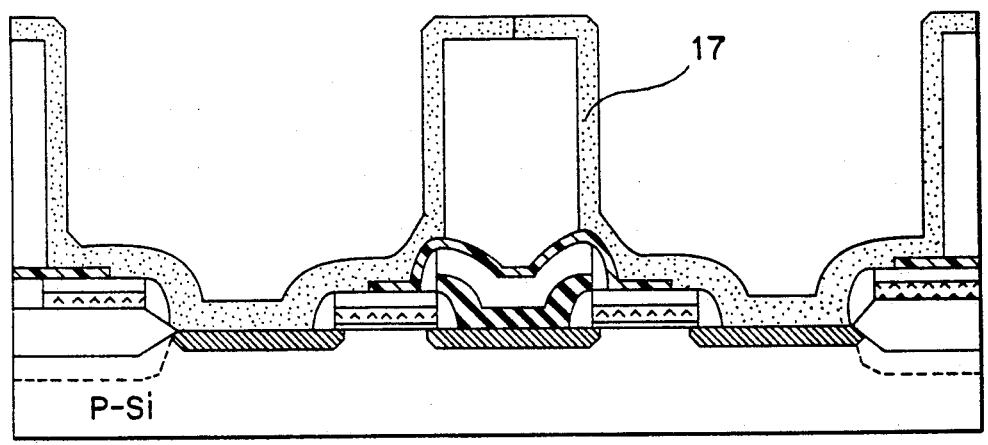
Figure 4G:
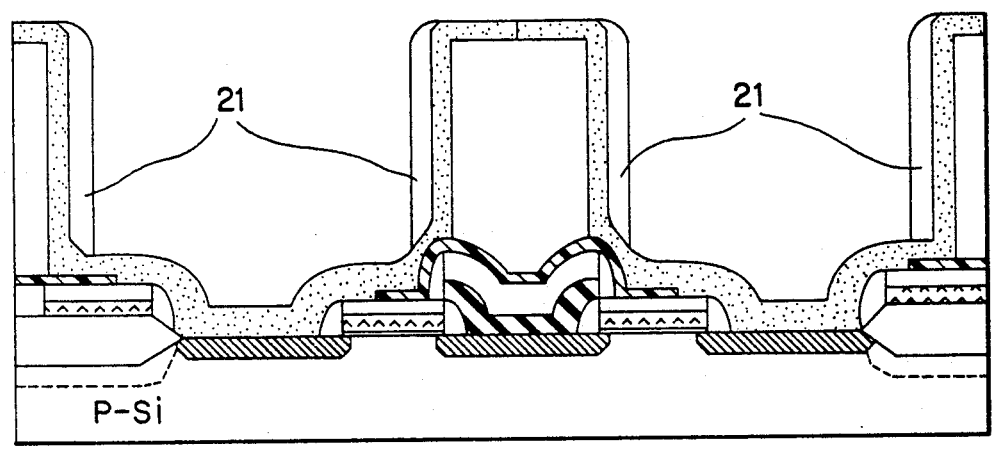

FIG. 4g shows a forming step of the oxide film side wall spacer, wherein after the polysilicon electrode 17 is deposited, the oxide film is spread at a thickness of about 50-100 nm by the chemical vapor deposition method, and dry etched by a reactive ion etching (RIE) method whereby the oxide film side wall spacer 21 is allowed to remain.

Figure 4H:
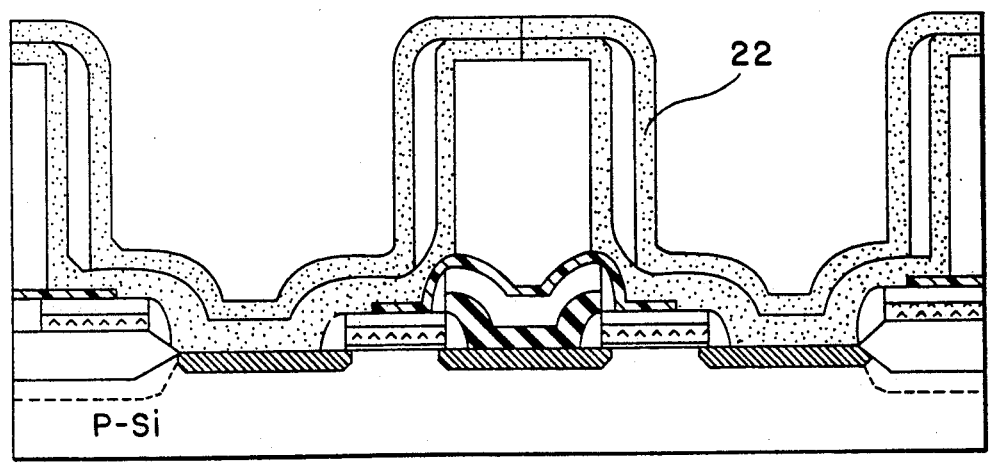

FIG. 4h shows a forming step of a second polysilicon electrode, wherein after an oxide film wall spacer 21 is formed, the polysilicon is deposited secondly to be thin at the charge storing electrode. However, the polysilicon, at this moment, is deposited at the same thickness as the first polysilicon electrode 17 whereby the second polysilicon electrode 22 is formed.

Figure 4I:
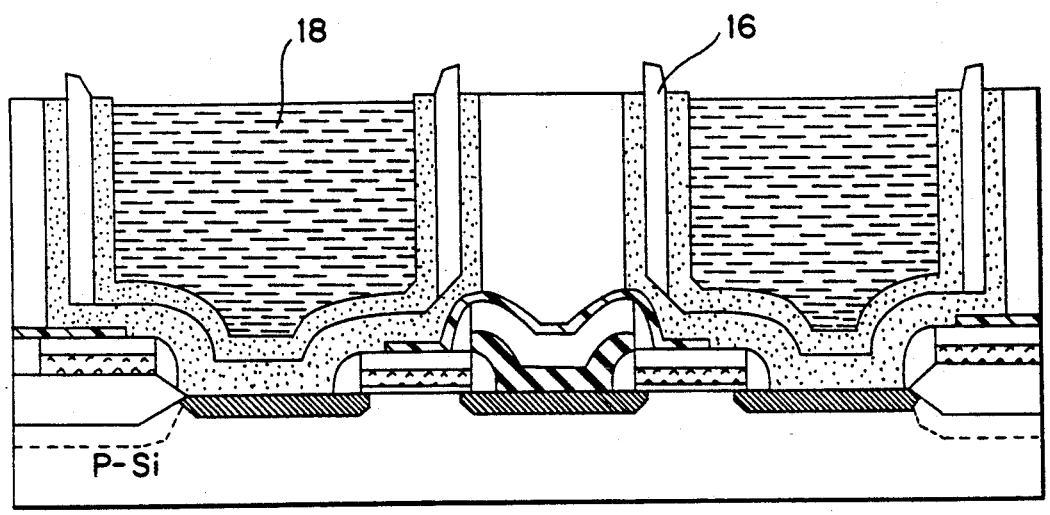
Figure 5:
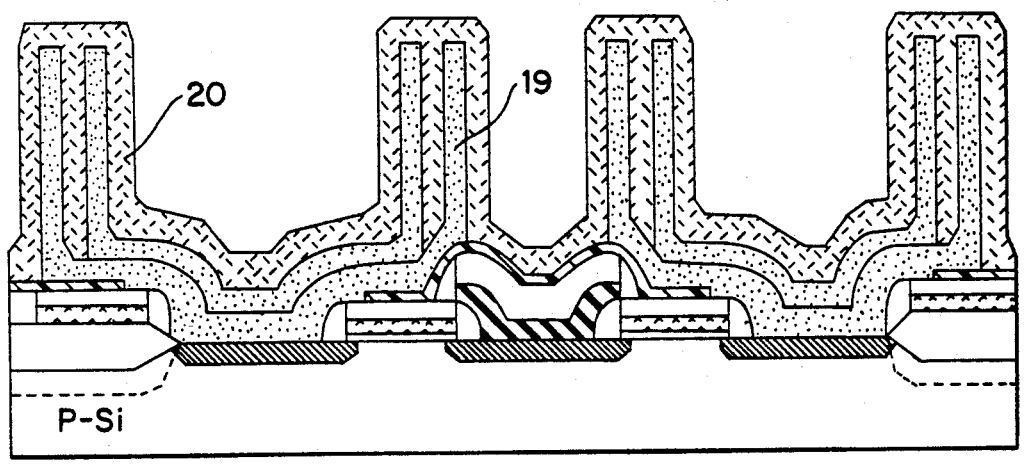
FIG. 5 is a cross-sectional view of a stacked structure DRAM cell having double cup shape according to the second embodiment of the present invention.

FIG. 4i shows an isolating step of the other charge storing side wall electrode from the adjoining cell, wherein as shown in FIG. 2(g), the polysilicon located at the top end portion of the oxide film 16 of the grid shape is etched by utilizing the photo resist 18 of liquid phase whereby the electrode is isolated from the adjoining cell. Thus a storing electrode of double cup shape in which the electrode of a cup shape is superposed, is manufactured. When the capacitor dielectric film 19 is formed by the same process as the aforementioned first embodiment and then the plate electrode 20 is formed, the DRAM cell stacked structure having a double cup shape is completed (FIG. 5).

FIG. 6 shows the state of the layout of the DRAM cell, wherein reference numeral 24 represents a word line, numeral 25 is a bit line, numeral 26 is a storage electrode contacting portion, numeral 27 is an active region, numeral 28 is a bit line contact, numeral 29 is an oxide mask of the grid shape or the storage electrode, and numeral 30 represents a capacitor plate, respectively.

Therefore, according to the process of the present invention, the transfer transistor is firstly manufactured, the bit line is formed and then the oxide film of a grid shape is formed highly between the cell and cell by the minimum design rule, and thereafter, the polysilicon is deposited and then the photo resist is spread and etched back, and the polysilicon of the top end portion of the oxide film is etched by the RIE method, whereby the polysilicon side wall is allowed to remain and the storage node of the cup shape is formed. The polysilicon and the CVD oxide film are deposited in turn on the oxide film of the grid shape and then the oxide film is etched by the RIE method whereby the oxide film spacer is formed. And then the polysilicon is deposited one more time, and thereafter, the photo resist is spread and etched back whereby the photo resist of the top end portion of the oxide film of the grid shape and the polysilicon of double layer are etched in turn by the RIE method and the storage electrode of a double cup shape is obtained so that the height of the storage electrode is raised in maximum and simultaneously, the area also expanded, whereby the area efficiency is increased, at the same time, the process is possible by mask numbers the same as the mask layer numbers of the conventional stacked structure, and its structure is also simple.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method for forming a DRAM cell stacked structure having a polysilicon storage electrode of a cup shape comprising the steps of:
    defining an active region on a p-type silicon substrate;
    forming a transistor and a polysilicide layer for a bit line;
    depositing a silicon nitride film of the thickness of about 50-100 nm as an etch stop layer;
    defining a contacting portion between a storage electrode and a source of said transistor and forming a first oxide film on said silicon nitride film to form a cup-shaped portion of a charge storing electrode;
    depositing a first charge storing polysilicon electrode of the thickness of 50-100 nm as said charge storing electrode and depositing a second oxide film to form oxide film side wall spacers on both side walls of said first charge storing polysilicon electrode;
    depositing a second polysilicon electrode, depositing a photo resist of liquid phase on said second polysilicon electrode, and etching back said second polysilicon electrode to form a double polysilicon electrode; and
    injecting ions of an N+ impurity to said first and second polysilicon electrodes, a capacitor dielectric film, and then defining a plate electrode.

2. The method for forming a DRAM cell stack structure of claim 1, wherein in order to form said bit line before formation of the storage electrode, said active region has a V-shaped structure and has a bit line contact portion formed at the center thereof.

* * * * *